(12) United States Patent
Jadus et al.

(10) Patent No.: US 12,706,599 B2
(45) Date of Patent: Aug. 11, 2026

(54) GATE DRIVER CIRCUIT FAULT DETECTION TECHNIQUES

(71) Applicant: Analog Devices, Inc., Wilmington, MA (US)

(72) Inventors: Brian K. Jadus, Williston, VT (US); Steven John Tanghe, Essex Junction, VT (US)

(73) Assignee: Analog Devices, Inc., Wilmington, MA (US)

( * ) Notice: Subject to any disclaimer, the term of this patent is extended or adjusted under 35 U.S.C. 154(b) by 9 days.

(21) Appl. No.: 18/622,459

(22) Filed: Mar. 29, 2024

(65) Prior Publication Data

US 2025/0309881 A1 Oct. 2, 2025

(51) Int. Cl.
*H03K 17/08* (2006.01)
*G01R 31/327* (2006.01)

(52) U.S. Cl.
CPC ......... *H03K 17/08* (2013.01); *G01R 31/3277* (2013.01)

(58) Field of Classification Search
CPC ............................ H03K 17/08; G01R 31/3277
USPC .......................................................... 361/101
See application file for complete search history.

(56) References Cited

U.S. PATENT DOCUMENTS 5,408,150 A 4/1995 Wilcox
5,933,199 A * 8/1999 Yoon ..................... H04N 5/202 348/790
10,250,135 B2 * 4/2019 Yu ......................... H02M 3/156
10,396,571 B2 * 8/2019 Rana .................. H02J 7/00308
11,150,300 B2 10/2021 Jadus et al.
11,171,559 B2 11/2021 Tanghe et al.
11,381,075 B2 * 7/2022 Li ........................... H02H 9/02
11,519,954 B2 * 12/2022 Gunasekaran ..... G01R 31/3277
11,722,130 B1 * 8/2023 Tran .................... H03K 17/165 361/93.1
2006/0256492 A1 * 11/2006 Zhao ................. H03K 17/0822 361/93.7
2010/0244800 A1 * 9/2010 Nakamura ............. H02M 1/32 323/284
2013/0083442 A1 * 4/2013 Hiyama ............ H03K 17/0828 361/93.7
2014/0204492 A1 * 7/2014 Hu ........................ H05B 47/24 361/91.1
2015/0061907 A1 * 3/2015 Miglani ................. H03M 3/39 341/143
2017/0126115 A1 * 5/2017 Schulz ............. H02M 7/53871
2017/0331270 A1 * 11/2017 Mattos ................ H02H 1/0007
2018/0198442 A1 * 7/2018 Hokazono ............. H03K 17/30

(Continued)

FOREIGN PATENT DOCUMENTS

CN 107887895 B * 1/2021 ......... H03K 17/0826
DE 102017122765 A1 4/2018

*Primary Examiner* — Dharti H Patel
(74) *Attorney, Agent, or Firm* — Schwegman Lundberg & Woessner, P.A.

(57) ABSTRACT

A desaturation detection circuit is described that uses two or more desaturation circuit threshold values, which shifts the desaturation threshold value in a normal operational mode to a higher voltage when the active short circuit (ASC) signal is present in a faulted operational mode. Including two or more desaturation detection circuit threshold values allows a lower desaturation threshold value during a normal operational mode and a higher voltage in a faulted operational mode, or mode-dependent threshold value selection.

15 Claims, 4 Drawing Sheets

(56) References Cited

U.S. PATENT DOCUMENTS

| | | | | |
|---|---|---|---|---|
| 2019/0319445 | A1* | 10/2019 | Ye | H02H 1/0007 |
| 2019/0393766 | A1* | 12/2019 | Nagamatsu | H02M 1/15 |
| 2021/0181254 | A1 | 6/2021 | Jadus et al. | |
| 2021/0344335 | A1* | 11/2021 | Chen | H03K 17/0828 |
| 2023/0098482 | A1* | 3/2023 | He | H05B 45/3725<br>315/307 |
| 2023/0187922 | A1* | 6/2023 | Randazzo | H02H 5/048<br>361/87 |
| 2025/0035678 | A1* | 1/2025 | Liang | G01R 19/16538 |
| 2025/0132675 | A1* | 4/2025 | Fontana | G05F 1/575 |
| 2025/0309881 | A1* | 10/2025 | Jadus | G01R 31/3277 |

* cited by examiner

GATE DRIVER CIRCUIT FAULT DETECTION TECHNIQUES

FIELD OF THE DISCLOSURE

This document pertains generally, but not by way of limitation, to fault detection of power transistors.

BACKGROUND

In power electronics, the efficient management of electrical energy is a cornerstone of numerous applications, ranging from renewable energy systems to industrial automation and consumer electronics. At the heart of these systems are power switches, such as Insulated Gate Bipolar Transistors (IGBTs) and Field-Effect Transistors (FETs), which play an important role in controlling the flow of electrical energy. These components enable the conversion, distribution, and regulation of electrical power with high efficiency and precision.

Power switches face various operational challenges that may impact their performance and longevity. Among these challenges is the management of desaturation events, which is an example of an overcurrent event. Such events may lead to excessive power dissipation and, potentially, to the damage of the power switch itself. The ability to effectively manage these events is important for maintaining the reliability and safety of power electronic systems.

Gate driver circuits are integral to the operation of power switches, providing the necessary drive voltage to control the switching between conductive (on) and non-conductive (off) states. Beyond basic control functions, gate driver circuits are increasingly incorporating advanced protective features designed to detect and respond to fault conditions to prevent damage to the power switch and to ensure the continued safe operation of the overall system.

SUMMARY OF THE DISCLOSURE

This disclosure describes a desaturation detection circuit that uses two or more desaturation circuit threshold values, which shifts the desaturation threshold value in a normal operational mode to a higher voltage when the ASC signal is present in a faulted operational mode. Including two or more desaturation detection circuit threshold values allows a lower desaturation threshold value during a normal operational mode and a higher voltage in a faulted operational mode, or mode-dependent threshold value selection.

In some aspects, this disclosure is directed to a gate driver circuit for driving a transistor, the gate driver circuit comprising: a source of a current coupled with a terminal of the transistor; and an overcurrent detection circuit including: a comparator configured for: receiving a voltage representing an ON voltage across the transistor; comparing the voltage to a threshold value, wherein the threshold value is selected from a plurality of threshold values; and generating an output signal when the voltage exceeds the threshold value, wherein the output signal represents an overcurrent condition of the transistor.

In some aspects, this disclosure is directed to a method for dynamically adjusting a desaturation detection threshold in a gate driver circuit, the method comprising: sourcing a current to a terminal of a transistor; receiving a voltage representing an ON voltage across the transistor; comparing the voltage to a threshold value, wherein the threshold value is selected from a plurality of threshold values; and generating an output signal when the voltage exceeds the threshold value, wherein the output signal represents a desaturation event of the transistor.

In some aspects, this disclosure is directed to a desaturation detection circuit comprising: a comparator configured for: receiving a voltage representing an ON voltage across a transistor; comparing the voltage to a threshold value, wherein the threshold value is selected from a plurality of threshold values; and generating an output signal when the voltage exceeds the threshold value, wherein the output signal represents an overcurrent condition of the transistor; and a switch configured for selecting, based on an operational mode, the threshold value from the plurality of threshold values.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Active short circuit (ASC) refers to a protective feature in power electronic systems designed to actively manage and mitigate the effects of a short circuit event. When a short circuit occurs, it may cause a sudden and substantial increase in current that can damage electronic components, such as Insulated Gate Bipolar Transistors (IGBTs) and Field-Effect Transistors (FETs), due to excessive heat generation. The ASC protection mechanism is particularly important in systems where power devices are at risk of being exposed to short circuit conditions, such as in motor drives, power converters, and inverters. It helps to prevent component damage, allowing the system to either continue operating under fault conditions or to shut down safely.

ASC works by detecting a short circuit condition and then actively controlling the power device to limit the current flow to a safe level. ASC is used to force the gate driver's output to a defined state that is independent of the normal control inputs. ASC is useful in motors operating in "field-weakening" control, which is a technique that allows back-emf (BEMF) greater than a DC bus voltage for advantages such as higher motor speed or other optimizations. If control is lost (fault), then BEMF is greater than the DC bus voltage, which may cause battery or component damage. When ASC is detected, the system controller generates an ASC signal that is applied to the gate driver circuit, which applies a three-phase short across the motor by turning on all high or low-side inverter transistors. By doing so, the ASC limits the fault current to a level that the system can handle without sustaining damage.

ASC mode is used in "emergencies" and involves high currents that may trip the desaturation detection circuit with a normal threshold. If this happens, the desaturation circuit shuts down the gate driver circuit, defeating the purpose of the ASC feature.

Some desaturation detection circuit approaches set the desaturation threshold value at a high voltage to avoid triggering the desaturation detection circuit during an ASC condition. Or, in other desaturation detection circuit approaches, an ASC signal that is indicative of the ASC condition takes priority over the desaturation condition. However, the system still needs some protection against transistor damage from extreme currents.

The present inventors have recognized the desirability of a desaturation detection circuit, a type of overcurrent circuit, that uses two or more desaturation circuit threshold values, which shifts the desaturation threshold value in a normal operational mode to a higher voltage when the ASC signal is present in a faulted operational mode. Including two or more desaturation detection circuit threshold values allows a lower desaturation threshold value during a normal operational mode and a higher voltage in a faulted operational mode, or mode-dependent threshold value selection.

Figure 1:
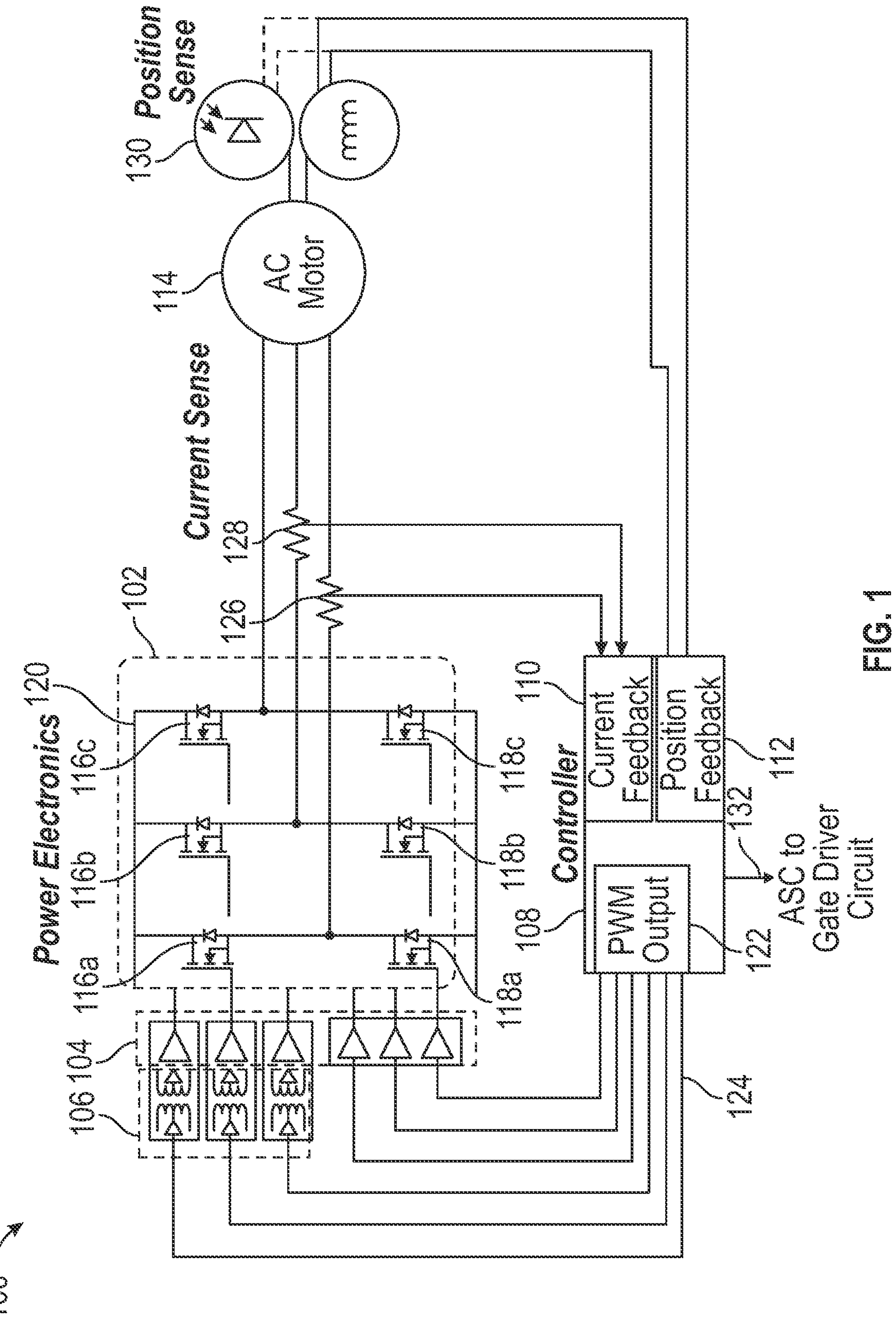
FIG. 1 is a simplified schematic diagram of an example of a current control system that may implement various techniques of this disclosure.

FIG. 1 is a simplified schematic diagram of an example of a current control system 100 that may implement various techniques of this disclosure. In the non-limiting example shown, the current control system 100 forms part of a motor drive signal chain, specifically designed for an alternating current (AC) motor. The current control system 100 includes a three-phase half-bridge circuit 102, gate driver circuits 104, isolator components 106, a controller 108 with a current feedback circuit 110 and a position feedback circuit 112, and sensors, all of which contribute to the precise and efficient operation of the AC motor 114.

The three-phase half-bridge circuit 102 includes six transistors (or "power switches"), namely the transistors 116*a*-116*c* and the transistors 118*a*-118*c*, arranged into three half-bridge configurations. Each half-bridge, e.g., the transistor 116*a* and the transistor 118*a*, is responsible for driving one phase of the AC motor 114. The controller 108 controls the transistors within these bridges to switch on and off in a synchronized manner, facilitating the precise control of electrical current flowing through the windings of the AC motor 114. This control is pivotal in managing the speed and torque of the AC motor 114.

Integral to the operation of the three-phase half-bridge circuit 102 are the gate driver circuits 104, which are coupled with the control terminals, e.g., gate terminals, of the transistors, such as Insulated Gate Bipolar Transistors (IGBTs) and Field-Effect Transistors (FETs). The gate driver circuits 104 provide the necessary drive voltage to actuate the transistors, ensuring efficient switching.

For the top half of the three-phase half-bridge circuit 102, which includes the transistors 116*a*-116*c*, isolator components 106 are coupled with a corresponding gate driver circuit 104. The transistors 116*a*-116*c* are coupled with a high voltage supply 120, such as coupled with a battery stack in an electric vehicle. In some examples, the high voltage supply 120 may be 400 volts or higher. The isolator components 106 electrically isolate the low-voltage control side of the gate drivers, such as the side coupled with the controller 108, from the high-voltage power side of the three-phase half-bridge circuit 102. Such isolation protects the controller 108 from high-voltage transients and facilitates safe signal transmission between the controller 108 and the gate driver circuit 104.

The controller 108 includes a Pulse Width Modulation (PWM) output circuit 122. The PWM output circuit 122 generates PWM output signals 124 directed to the gate driver circuit 104. The PWM output signals 124 modulate the duty cycle of the transistor switching, thereby controlling the power delivered to the windings of the AC motor 114. Additionally, the controller 108 is equipped with a current feedback circuit 110 and a position feedback circuit 112, which allow closed-loop control.

The current feedback circuit 110 is designed to receive input from a current sensor, such as formed by a current sense resistor 126 and a current sense resistor 128, which are positioned in two phases of the three-phase half-bridge circuit 102. The current feedback circuit 110, via the current sensor, monitors the current flowing through the windings of the AC motor 114, providing real-time feedback to the controller 108. Using this information, the controller 108 may adjust the PWM output signals 124 to ensure the AC motor 114 operates within desired parameters.

The current control system 100 also includes a position sensor 130, such as an optical sensor or a rotary encoder, coupled with the AC motor 114. The position sensor 130 provides precise feedback on the rotor position to the position feedback circuit 112 within the controller 108. Accurate position feedback is important for controlling the speed and position of the AC motor 114 with precision, enabling applications that demand exact motion control.

The current control system 100 is designed to couple each phase of the three-phase half-bridge circuit 102 with a winding in the AC motor 114, facilitating the conversion of electrical energy into mechanical motion. The inclusion of a current sensor and a position sensor provide the necessary feedback for the controller 108 to fine-tune the operation of the AC motor 114 in real-time, thereby optimizing performance and efficiency.

In a motor drive system, such as those implemented in electric vehicle traction drives, an alternating current motor, e.g., AC motor 114, is driven by a three-phase half-bridge circuit controlled by a system controller, e.g., the controller 108. The system controller enables each transistor of the three-phase half-bridge circuit with pulse width modulated patterns, such as generated by PWM output circuit 122. The delivered current from the three-phase half-bridge circuit into the inductance of the motor windings of the AC motor appears as a three-phase sine wave. A function of traction drive system controllers is to operate the motor safely and protect the system and maintain control on the vehicle in system shorts or vehicle accidents.

A desaturation (de-sat) detection circuit is an overcurrent protective circuit in power electronics systems, particularly in applications involving high-power switches such as IGBTs and FETs. The primary function of a desaturation circuit is to monitor the voltage across a power switch during operation, such as the transistors of the three-phase half-bridge circuit 102 in FIG. 1. Two main short conditions may be observed by the desaturation detection circuit: 1) a short of the complimentary switch to a supply or ground, considered a hard switching fault (HSF), or 2) a short in the motor winding, considered a fault under load (FUL).

Typically, the HSF event is during transistor turn-on. The voltage is initially high across the transistor and, after a time delay, the desaturation circuit is enabled to observe if the voltage is high in the case of an HSF. A fault under load event is typically a lower current event that increases the voltage of the transistor relative to the time constant of the motor winding inductance. A desaturation detection circuit monitors the voltage on the collector or drain of a power transistor used in a motor drive system to detect if an excessive amount of current is flowing in the power transistor. If an excessive amount of current is flowing in the power transistor when it is turned on, the voltage rises due to the resistance of the transistor. The desaturation detection circuit includes a comparator with a threshold set appropriately for the power transistor design and is intended to detect both fault cases HSF and FUL. If the voltage exceeds a predefined threshold, indicative of a desaturation condition, the desaturation circuit intervenes by initiating a protective response.

The response may involve the controller 108 turning off the affected power switch to prevent excessive power dissipation that might lead to thermal runaway and failure of the switch. By detecting and addressing desaturation events, the desaturation circuit plays a critical role in safeguarding power electronic systems against overcurrent conditions, ensuring their reliability and longevity. The integration of a desaturation circuit is particularly useful in systems where the power transistors are subjected to high switching frequencies and load conditions, making them susceptible to rapid degradation and failure without adequate protection.

ASC works by actively controlling the power device to limit the current flow to a safe level when a short circuit condition is detected. When ASC is detected, the system controller, such as the controller 108, generates an active short circuit signal 132 to the gate driver circuit 104, which applies a three-phase short across the motor by turning on all high or low-side inverter transistors. In some other examples, the system controller turns on both devices in the half-bridge in a controlled manner to discharge the high-voltage supply. By doing so, the ASC limits the fault current to a level that the system can handle without sustaining damage.

This disclosure describes a desaturation detection circuit that uses two or more desaturation circuit threshold values, which shifts the desaturation threshold value in a normal operational mode to a higher voltage when the active short circuit signal 132 is present in a faulted operational mode. As described in more detail below with respect to FIG. 3, including two or more desaturation detection circuit threshold values allows mode-dependent threshold value selection, e.g., a lower desaturation threshold value during a normal operational mode of the current control system 100 and a higher voltage in a faulted operational mode of the current control system 100. The desaturation detection circuit of this disclosure is designed to modify the threshold value, ensuring comprehensive protection for the system in all conditions, including Active Short Circuit (ASC) mode with an elevated threshold, as well as normal mode with a reduced threshold, effectively safeguarding against ASC, High Side Fault (HSF), and Full Load (FUL) scenarios.

The faulted operational mode with the higher voltage threshold includes the ASC mode. The system may be in a fault for another reason that may not require the ASC function to be enabled. In a faulted operational mode, the gate driver circuit is typically forcing the external power switch into an off condition. The normal operational mode is where the gate driver circuit is operating with a PWM signal turning the control terminal, e.g., gate, on and off in command from the system controller.

Figure 2:
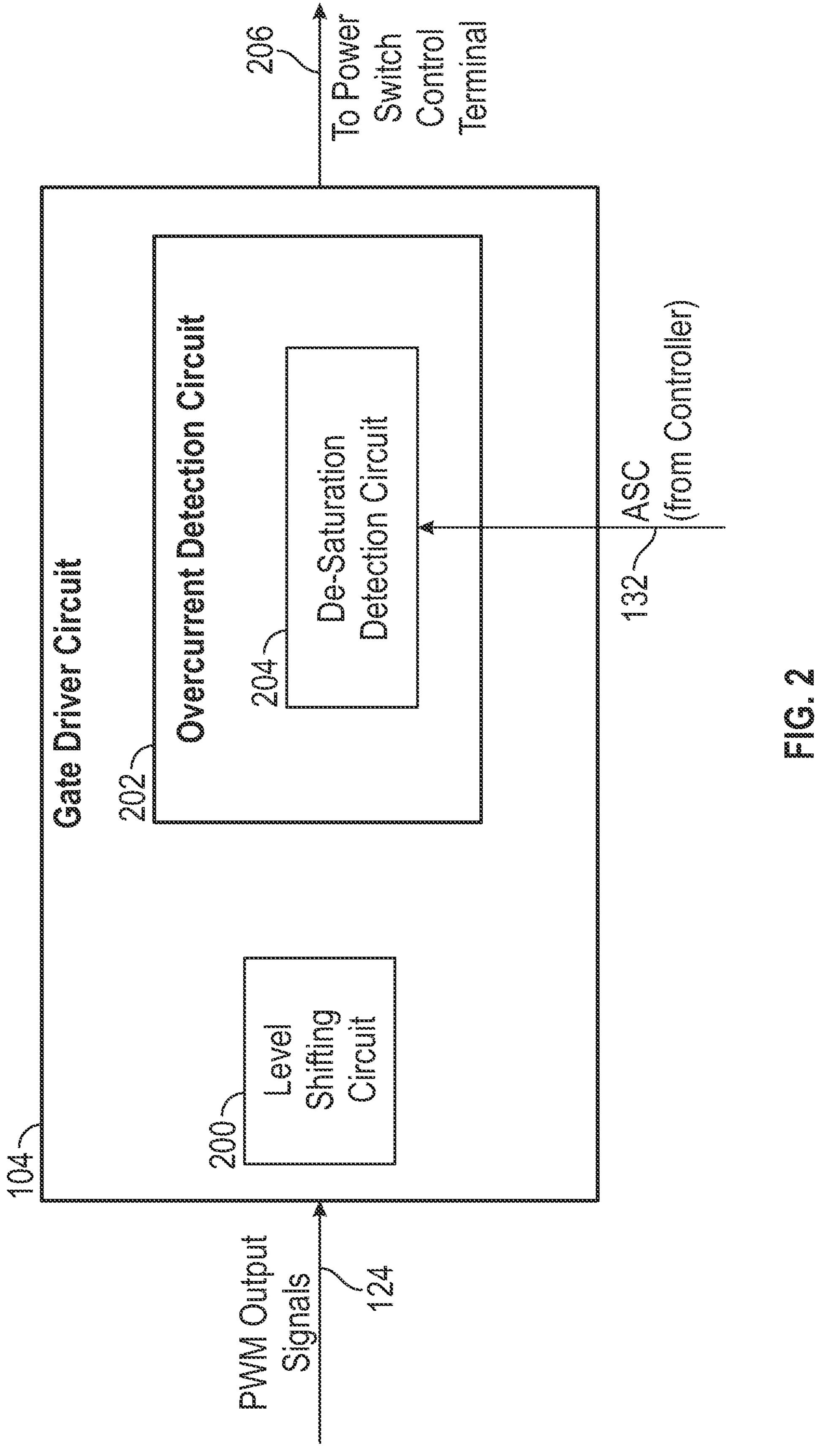
FIG. 2 is a block diagram of an example of a gate driver circuit that may implement various techniques of this disclosure.

FIG. 2 is a block diagram of an example of a gate driver circuit for driving a transistor that may implement various techniques of this disclosure. The gate driver circuit 104 is configured for receiving the PWM output signals 124 from the controller 108 of FIG. 1. The gate driver circuit 104 includes various circuits, such as a level shifting circuit 200 to convert the low-voltage PWM output signals 124 to the higher voltage levels required to drive the gate of the transistors.

The gate driver circuit 104 further includes an overcurrent detection circuit 202. Examples of the overcurrent detection circuit 202 include circuits for overcurrent protection to detect excessive current through the power transistors, such as a desaturation detection circuit 204. The desaturation detection circuit 204 may implement various techniques of this disclosure and is shown in detail in FIG. 3. The gate driver circuit 104 generates an output signal 206 (an example of one of the output signals 124 in FIG. 1) that is applied to a control terminal of a power switch, such as a gate terminal of one of the transistors 116*a*-116*c* and the transistors 118*a*-118*c* of FIG. 1, e.g., the gate terminal 302 in FIG. 3.

The gate driver circuit 104 may include additional circuits, such as an under-voltage lockout (UVLO) circuit to ensure the gate driver operates within its specified voltage range, a thermal shutdown circuit to prevent operation at excessive temperatures, and a fault reporting circuit to inform the system controller of any detected issues.

Figure 3:
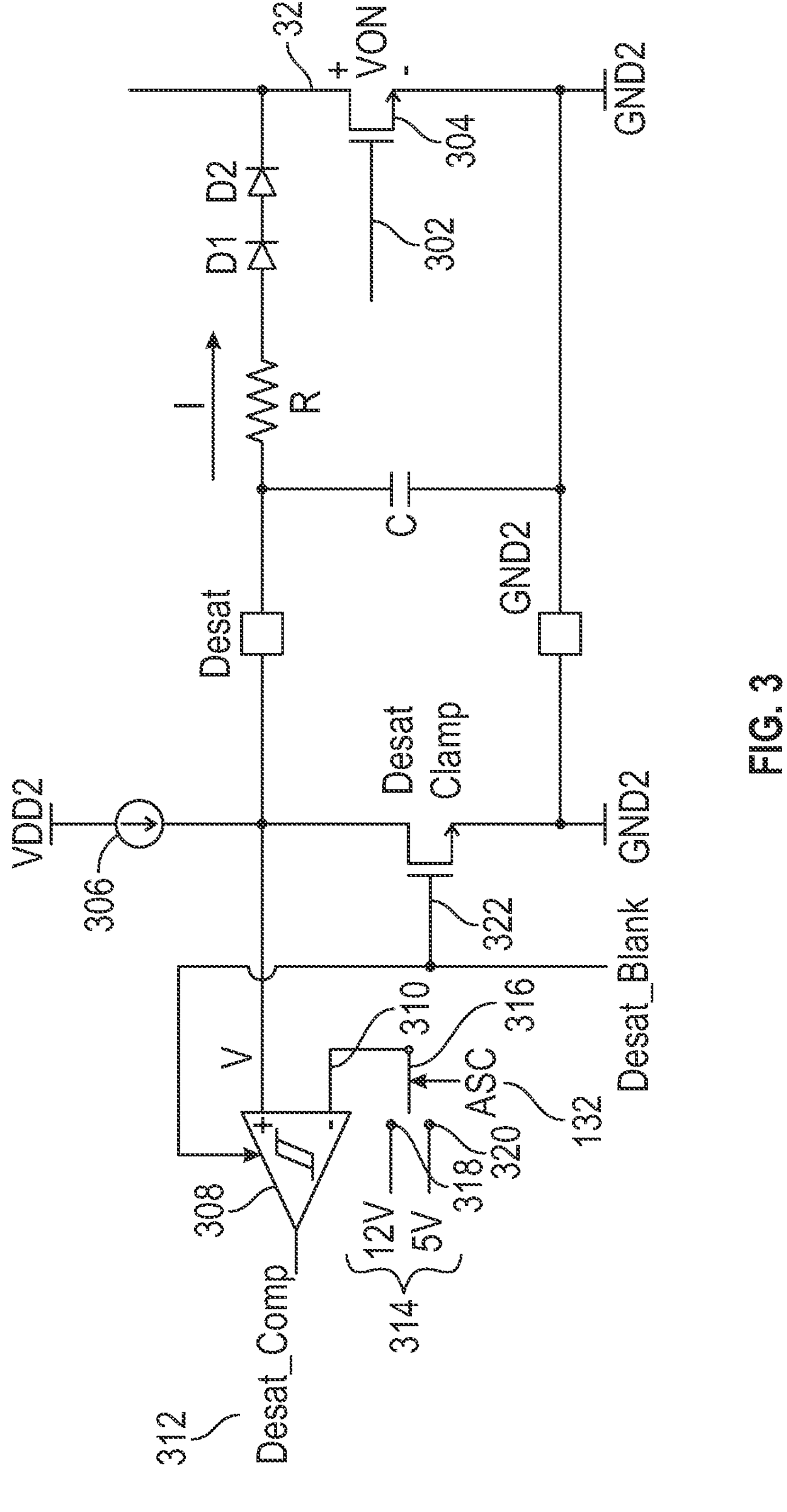
FIG. 3 is a schematic diagram of an example of a desaturation detection circuit that may implement various techniques of this disclosure.

FIG. 3 is a schematic diagram of an example of a desaturation detection circuit that may implement various techniques of this disclosure. The desaturation detection circuit 204 includes a source of a current I through a resistor R electrically coupled with a drain terminal 324 of a transistor 304, such as one of the transistors 116*a*-118*c* shown in FIG. 1. The resistor R provides a user-selectable effective threshold shift of the desaturation condition (=I*R). In some examples, the source of the current I through the resistor R is a current source, such as the current source 306, e.g., a transistor configured to operate as a current source. In some examples, a resistor is the source of the current I.

The desaturation detection circuit 204, which is an example of an overcurrent detection circuit, includes a comparator 308, e.g., a hysteresis comparator. The comparator 308 is configured for receiving a voltage V representing an ON voltage across the transistor 304, e.g., supplied to a non-inverting terminal. For example, the voltage V representing an ON voltage (VON) across the transistor 304 is generated by the current I through the resistor R and the diodes D1, D2, e.g., high-voltage diodes. The two diodes D1, D2 may be external components.

The comparator 308 is further configured for comparing the voltage to a signal representing a threshold value 310, e.g., supplied to an inverting terminal, and generating an output signal 312 when the voltage V exceeds the threshold value 310, where the output signal 312 ("DESAT_COMP") represents an overcurrent condition of the transistor 304.

In accordance with this disclosure, the threshold value represented on signal 310 is selected from a plurality of threshold values 314. In the non-limiting example shown, two threshold values are shown, namely a 5-volt (V) threshold value and a 12V threshold value. Other examples may include more than two threshold values from which a threshold value is selected, and those threshold values may be different than 5V and 12V.

The desaturation detection circuit 204 includes a switch 316 configured for selecting, based on an operational mode, the threshold value 310 from the plurality of threshold values 314. In some examples, the switch 316 is a multiplexer. The switch 316 includes terminals to receive corresponding ones of the plurality of threshold values. For example, the switch 316 includes a first terminal 318 to receive the 12V threshold value and a second terminal 320 to receive the 5V threshold value. The switch 316 is configured for selecting a first threshold value, e.g., the 5V threshold value, during a first operational mode and a second threshold value, higher than the first threshold value, e.g., the 12V threshold value, during a second operational mode, such as a faulted operational mode.

In some examples, the second operational mode is an active short circuit mode. For example, the desaturation detection circuit 204 is configured for receiving the active short circuit signal 132 from the controller 108 of FIG. 1.

Without being bound by theory, the operation of the desaturation detection circuit 204 will be briefly described. When the control terminal 302 of the transistor 304 is turned ON, the drain voltage is pulled down towards ground, causing the diodes to conduct and allowing current to flow through the resistor R. The desaturation detection circuit 204 includes a desaturation clamp 322, such as a transistor, that assists in monitoring and protecting the transistor 304, e.g., a silicon carbide (SiC) transistor.

The desaturation clamp 322 holds the input to the comparator 308 low (not triggering a desat event) and protects the internal circuitry while the external power switch (SiC, IGBT, FET, etc.) is OFF and during the blanking period after the power switch is turned ON to protect against false tripping while the drain/collector voltage is transitioning.

To avoid false triggering during the initial activation of the transistor 304, the desaturation clamp 322 is turned ON to pull the node "DESAT" low. The desaturation detection circuit 204 uses a blanking period, such as by applying a blanking signal ("desat_blank") to the control terminal of the desaturation clamp 322 and to an enable pin of the comparator 308, which pulls the input to the comparator 308 low and disables the comparator 308. After a delay, which may be determined by the specific characteristics of the transistor 304, the blanking signal is removed, which enables the comparator 308 and turns OFF the desaturation clamp 322, thereby allowing the voltage at the node "DESAT" to increase. Additional delay may be added by adjusting a size of an external capacitor C. Under normal operation, the current through the resistor R and the two voltage drops of the diodes D1, D2 generates a voltage, e.g., 3V, at the node "DESAT", which is coupled with the non-inverting input of the comparator 308. During normal operation, the voltage at the node "DESAT" is below any of the plurality of threshold values, such as 5V and 12V in FIG. 3.

In the event of a fault condition, current through the transistor 304 increases, which in turn increases its drain voltage. This higher voltage, in turn, increases the voltage on the node "DESAT". If the voltage on the node "DESAT" exceeds the comparator's threshold due to the increased current, the comparator 308 trips and outputs the signal "DESAT_COMP" to indicate a desaturation condition.

Figure 4:
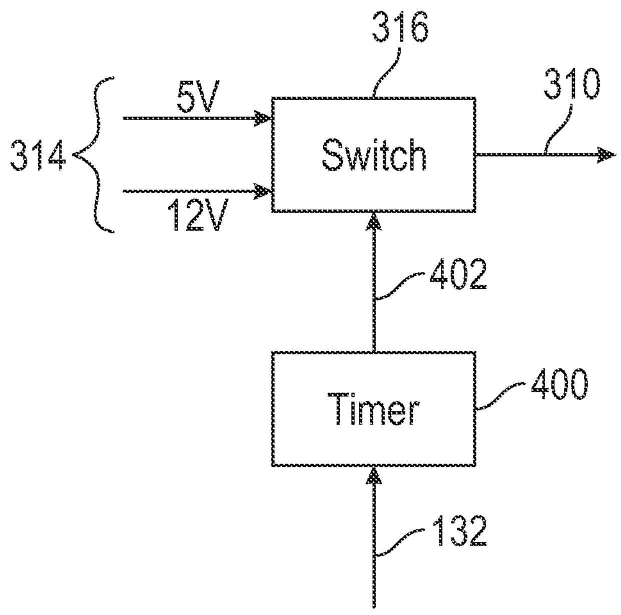
FIG. 4 is a block diagram of an example of a portion of the desaturation detection circuit of FIG. 3 including a timer that may be used to implement various techniques of this disclosure.

FIG. 4 is a block diagram of an example of a portion of the desaturation detection circuit 204 of FIG. 3 including a timer that may be used to implement various techniques of this disclosure. The timer 400 is electrically coupled with the control of the switch 316 of FIG. 3 to control the selection of the switch. As described above with respect to FIG. 3, the switch 316 is configured for selecting, based on an operational mode, and outputting the threshold value 310 from the plurality of threshold values 314. The timer 400 is coupled with an input of the switch 316. The timer 400 receives the active short circuit signal 132 and outputs a signal 402 selecting the threshold value, e.g., the second threshold value to the switch 316.

In some examples, the timer 400 is configured for controlling a duration for which the second threshold value, e.g., 12V, is applied to the input of the comparator 308 of FIG. 3 during the second operational mode, such as an active short circuit mode or other faulted operational mode. For example, the timer 400 starts upon receiving the signal 132 to select the second threshold of the switch 316, and the switch 316 selects the second threshold value. At the expiration of the timer, the timer 400 stops outputting the signal 402 selecting the threshold value, e.g., the second threshold value. In some examples, the signal 132 selecting the threshold value bypasses the timer 400 and the threshold value is applied directly to the input of the comparator 308.

In other examples, the timer 400 is configured for controlling a duration before which the second threshold value, e.g., 12V, is applied to the input of the comparator 308 of FIG. 3 during the second operational mode, such as an active short circuit mode or other faulted operational mode. For example, the timer 400 starts upon receiving the selection of the threshold value, e.g., the second threshold value, and outputs the signal selecting the threshold value only after the expiration of the timer. In some examples, the signal selecting the threshold value bypasses the timer 400 and the threshold value is applied directly to the input of the comparator 308.

In yet other examples, the timer 400 is configured for controlling a duration during which the second threshold value remains ON after the second operational mode, e.g., a faulted operational mode, is disabled and the first operational mode, e.g., a normal operational mode, is enabled. For example, the timer 400 controls the duration for which the signal representing the second threshold value is applied to the comparator 308 of FIG. 3 even after the active short circuit mode is no longer applied, and the normal operational mode is enabled.

Figure 5:
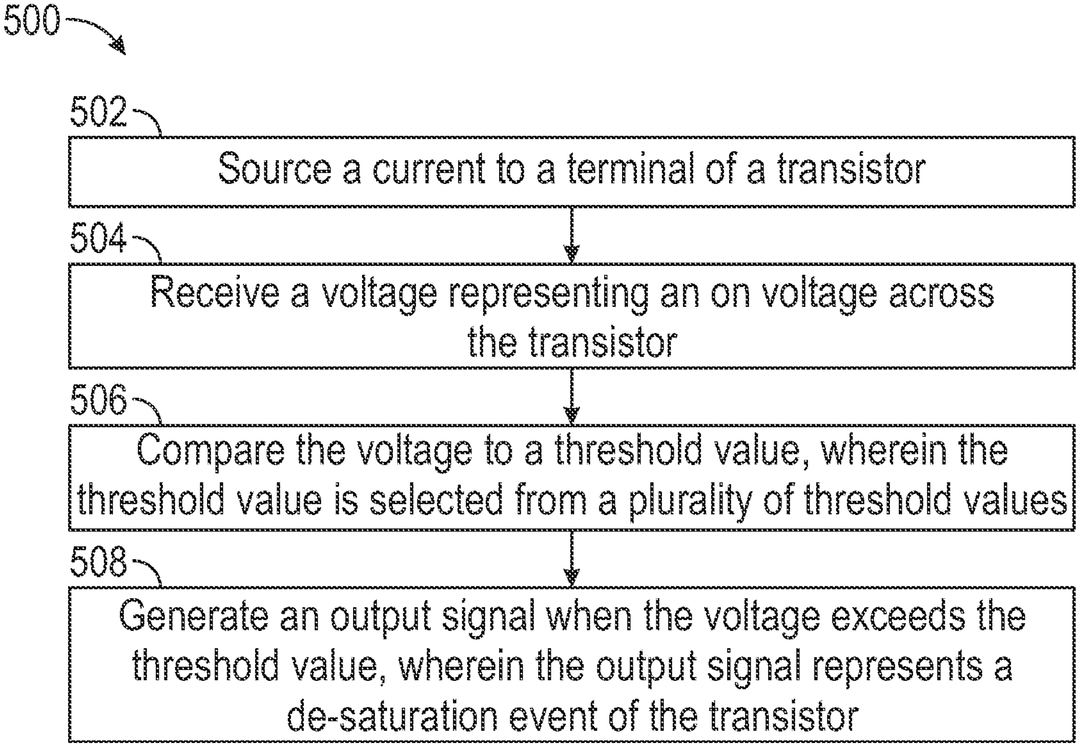
FIG. 5 depicts a flow diagram of an example of a method for dynamically adjusting a desaturation detection threshold in a gate driver circuit.

FIG. 5 depicts a flow diagram of an example of a method 500 for dynamically adjusting a desaturation detection threshold in a gate driver circuit.

At block 502, the method 500 includes sourcing a current to a terminal of a transistor, such as through a resistor. For example, a resistor or a transistor acting as a current source sources current through the resistor R in FIG. 3.

At block 504, the method 500 receives a voltage representing an ON voltage across the transistor. For example, the comparator 308 of FIG. 3 receives a voltage V that represents the ON voltage across the transistor 304.

At block 506, the method 500 compares the voltage to a threshold value, wherein the threshold value is selected from a plurality of threshold values. For example, the comparator 308 compares the voltage V at its non-inverting terminal to a threshold value 310 selected from a plurality of threshold values 314.

At block 508, the method 500 generates an output signal when the voltage exceeds the threshold value, wherein the output signal represents a desaturation event of the transistor. For example, the comparator 308 generates an output signal "DESAT_COMP" when the voltage V exceeds the threshold value 310.

Various Notes

Each of the non-limiting claims or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more claims thereof), either with respect to a particular example (or one or more claims thereof), or with respect to other examples (or one or more claims thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more claims thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A gate driver circuit for driving a transistor, the gate driver circuit comprising:

a source of a current coupled with a terminal of the transistor; and an overcurrent detection circuit including:

a switch configured for selecting, based on an operational mode, a threshold value from a plurality of threshold values; and a comparator configured for:

receiving a voltage representing an ON voltage across the transistor;

comparing the voltage to the threshold value; and generating an output signal when the voltage exceeds the threshold value, wherein the output signal represents an overcurrent condition of the transistor, wherein the plurality of threshold values includes a first threshold value and a second threshold value, and wherein the switch is configured for selecting the first threshold value during a normal operational mode and the second threshold value, higher than the first threshold value, during a faulted operational mode.

2. The gate driver circuit of claim 1, wherein the switch is a multiplexer.

3. The gate driver circuit of claim 1, wherein the faulted operational mode is an active short circuit mode.

4. The gate driver circuit of claim 1, wherein the overcurrent detection circuit comprises:

a timer configured for controlling a duration for which the second threshold value is applied during the faulted operational mode.

5. The gate driver circuit of claim 1, wherein the overcurrent detection circuit comprises:

a timer configured for controlling a duration before which the second threshold value is applied during the faulted operational mode.

6. The gate driver circuit of claim 1, wherein the overcurrent detection circuit comprises:

a timer configured for controlling a duration for which the second threshold value remains ON after the faulted operational mode is disabled.

7. The gate driver circuit of claim 1, wherein the gate driver circuit is coupled with a control terminal of the transistor, and wherein the transistor forms part of a bridge circuit.

8. A method for dynamically adjusting a desaturation detection threshold in a gate driver circuit, the method comprising:

sourcing a current to a terminal of a transistor;

selecting, based on an operational mode, a threshold value from a plurality of threshold values;

receiving a voltage representing an ON voltage across the transistor;

comparing the voltage to a threshold value, wherein the threshold value is selected from a plurality of threshold values; and generating an output signal when the voltage exceeds the threshold value, wherein the output signal represents a desaturation event of the transistor, wherein the plurality of threshold values includes a first threshold value and a second threshold value, and wherein the selecting includes selecting the first threshold value during a normal operational mode and selecting the second threshold value, higher than the first threshold value, during a faulted operational mode.

9. The method of claim 8, wherein the faulted operational mode is an active short circuit mode.

10. The method of claim 8, comprising:

controlling a duration for which the second threshold value is applied during the faulted operational mode.

11. The method of claim 8, comprising:

controlling a duration before which the second threshold value is applied during the faulted operational mode.

12. The method of claim 8, comprising:

controlling a duration during which the second threshold value remains ON after the faulted operational mode is disabled.

13. A desaturation detection circuit comprising:

a switch configured for selecting, based on an operational mode, a threshold value from a plurality of threshold values; and a comparator configured for:

receiving a voltage representing an ON voltage across a transistor;

comparing the voltage to a threshold value, wherein the threshold value is selected from a plurality of threshold values; and generating an output signal when the voltage exceeds the threshold value, wherein the output signal represents an overcurrent condition of the transistor, wherein the plurality of threshold values includes a first threshold value and a second threshold value, and wherein the switch is configured for selecting the first threshold value during a normal operational mode and the second threshold value, higher than the first threshold value, during a faulted operational mode.

14. The desaturation detection circuit of claim 13, wherein the faulted operational mode is an active short circuit mode.

15. The desaturation detection circuit of claim 13, comprising:

a timer for controlling one of the following:

a duration for which the second threshold value is applied during the faulted operational mode;

a duration before which the second threshold value is applied during the faulted operational mode; or a duration for which the second threshold value remains ON after the faulted operational mode is disabled.

* * * * *